United States Patent
Sisley et al.

(10) Patent No.: US 10,008,353 B2
(45) Date of Patent: Jun. 26, 2018

(54) METERING APPARATUS, SYSTEM AND DISTRIBUTION SYSTEM INCLUDING SAME

(71) Applicant: EATON CORPORATION, Cleveland, OH (US)

(72) Inventors: James Patrick Sisley, Baden, PA (US); Patrick Thomas Walsh, Coraopolis, PA (US); Paul Alan Merck, Crescent Township, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 96 days.

(21) Appl. No.: 14/926,182

(22) Filed: Oct. 29, 2015

(65) Prior Publication Data

US 2017/0125195 A1  May 4, 2017

(51) Int. Cl.
    *G08B 21/00* (2006.01)
    *H01H 71/04* (2006.01)
    *G01R 21/00* (2006.01)

(52) U.S. Cl.
    CPC ........... *H01H 71/04* (2013.01); *G01R 21/007* (2013.01)

(58) Field of Classification Search
None
See application file for complete search history.

(56) References Cited

U.S. PATENT DOCUMENTS

| | | | |
|---|---|---|---|
| 5,982,596 A * | 11/1999 | Spencer | H02H 3/04 361/102 |
| 8,643,501 B2 | 2/2014 | Sisley et al. | |
| 2014/0211345 A1* | 7/2014 | Thompson | B60L 11/1816 361/42 |

* cited by examiner

*Primary Examiner* — Brent Swarthout
(74) *Attorney, Agent, or Firm* — Eckert Seamans

(57) ABSTRACT

A metering apparatus includes a support; a connection apparatus disposed on the support and structured to be electrically connected with a circuit interrupter; a detection apparatus disposed on the support and structured to detect a first operational aspect of the circuit interrupter; a communication apparatus in communication with the detection apparatus, the communication apparatus being disposed on the support; a first bidirectional communications port disposed on a first side of the support and in communication with the communication apparatus; and a second bidirectional communications port disposed on a second side, opposite the first side, of the support and in communication with the communication apparatus. The communication apparatus is structured to communicate to another device via at least one of the first communications port or the second communications port at least a first parameter of the circuit interrupter based at least in part upon the first operational aspect.

4 Claims, 10 Drawing Sheets

US 10,008,353 B2

METERING APPARATUS, SYSTEM AND DISTRIBUTION SYSTEM INCLUDING SAME

BACKGROUND OF THE INVENTION

Field of the Invention

The disclosed and claimed concept relates generally to circuit interrupters and, more particularly, to a metering apparatus that is usable with a circuit interrupter. The disclosed and claimed concept further relates to a metering system and an electrical distribution system utilizing a plurality of such metering apparatuses.

Description of the Related Art

Numerous types of circuit interrupters, such as would include circuit breakers, are known in the art. Circuit breakers typically are employed to interrupt current to a circuit during various predefined overcurrent conditions, undervoltage conditions, and/or other conditions.

As is generally understood, a circuit breaker can either be in an ON condition, an OFF condition, or a TRIPPED condition. While the condition of such a circuit breaker typically can be discerned upon a visual inspection of the breaker, such a visual inspection often is impractical. Also, the determination of certain operational parameters of the breaker such as current flow and the like can be cumbersome to determine.

U.S. Pat. No. 8,643,501 describes a metering apparatus which connects directly to a breaker and detects one or more operational parameters of the breaker. The metering apparatus can than communicate the status of the breaker and/or one or more operational parameters of the breaker to another device. While such metering apparatus provides a solution which improves upon the prior art, the use of more than one of such metering apparatus in connection with more than one breaker within a breaker panel can be cumbersome due to the wiring connections required by each metering apparatus. It thus would be desirable to provide a way of overcoming these and other shortcomings of known circuit breakers and metering apparatus.

SUMMARY OF THE INVENTION

These needs and others are met by an improved metering apparatus that comprises: a support; a connection apparatus disposed on the support and structured to be electrically connected with a circuit interrupter; a detection apparatus disposed on the support and structured to detect at least a first operational aspect of the circuit interrupter; a communication apparatus in communication with the detection apparatus, the communication apparatus being disposed on the support; a first bidirectional communications port disposed on a first side of the support and in communication with the communication apparatus; and a second bidirectional communications port disposed on a second side, opposite the first side, of the support and in communication with the communication apparatus. The communication apparatus is structured to communicate to another device via at least one of the first communications port or the second communications port at least a first parameter of the circuit interrupter based at least in part upon the at least first operational aspect.

The first bidirectional communications port and the second bidirectional communications port may be disposed generally opposite from each other.

The first communications port may be disposed in a first alcove formed on the first side of the support and the second communications port may be disposed in a second alcove formed on the second side of the support.

The first alcove may open to the first side of the support and to a top face of the support and the second alcove may open to the second side of the support and to the top face of the support.

The detection apparatus may be structured to detect as the at least first operational aspect at least one of a condition of a bell alarm of the circuit interrupter and a condition of an auxiliary switch of the circuit interrupter, and wherein the communication apparatus is structured to communicate to the another device as the at least first parameter of the circuit interrupter at least one of an ON status, an OFF status, and a TRIPPED status of the circuit interrupter.

As another aspect of the disclosed and claimed concept, a metering system is provided which comprises: a computing device and a plurality of metering apparatuses. Each metering apparatus comprises: a support; a connection apparatus disposed on the support and structured to be electrically connected with a circuit interrupter; a detection apparatus disposed on the support and structured to detect at least a first operational aspect of the circuit interrupter; a first bidirectional communications port disposed on a first side of the support; a second bidirectional communications port disposed on a second side, opposite the first side, of the support; and a communication apparatus disposed on the support and in communications with the detection apparatus, the first bidirectional communications port and the second bidirectional communications port, the communication apparatus being structured to communicate to another device via at least one of the first communications port or the second communications port at least a first parameter of the circuit interrupter based at least in part upon the at least first operational aspect. One of the first bidirectional communications port or the second bidirectional communications port of a first metering apparatus of the plurality of metering apparatuses is in direct communication with the computing device and the other of the first bidirectional communications port or the second bidirectional communications port of the first metering apparatus of the plurality of metering apparatuses is in direct communication with one of the first bidirectional communications port or the second bidirectional communications port of a second metering apparatus of the plurality of metering apparatuses.

The first metering apparatus may comprise an auxiliary power input through which the first metering apparatus is powered and the second metering apparatus may be powered via power received via the one of the first bidirectional communications port or the second bidirectional communications port of the second metering apparatus.

The first metering apparatus may be powered via the one of the first bidirectional communications port or the second bidirectional communications port which is in direct communication with the computing device and the second metering apparatus may be powered via power received via the one of the first bidirectional communications port or the second bidirectional communications port thereof.

The first bidirectional communications port and the second bidirectional communications port of each metering apparatus of the plurality of metering apparatuses may be disposed generally opposite from each other.

For each metering apparatus, the first communications port may be disposed in a first alcove formed on the first side of the support and the second communications port may be disposed in a second alcove formed on the second side of the support. The first alcove may open to the first side of the support and to a top face of the support and the second alcove may open to the second side of the support and to the top face of the support.

The first metering apparatus and the second metering apparatus may be disposed such that the second side of the first metering apparatus is adjacent the first side of the second metering apparatus such that second alcove of the first metering apparatus and the first alcove of the second metering apparatus together generally form a wireway. The first bidirectional communications port of the first metering apparatus may be in direct communication with the computing device. The second bidirectional communications port of the first metering apparatus may be in direct communication with the first bidirectional communications port of the second metering apparatus. The direct communication between the second bidirectional communications port of the first metering apparatus and the first bidirectional communications port of the second metering apparatus may be provided by a jumper cable disposed completely within the wireway.

As a further aspect of the disclosed and claimed concept, an electrical distribution system comprises: an enclosure; a computing device disposed outside of the enclosure; a plurality of circuit interrupters disposed in the enclosure; and at least two metering apparatuses disposed in the enclosure adjacent two adjacent circuit interrupters of the plurality of circuit interrupters. Each metering apparatus comprises: a support; a connection apparatus disposed on the support and electrically connected with a circuit interrupter; a detection apparatus disposed on the support and structured to detect at least a first operational aspect of the circuit interrupter; a first bidirectional communications port disposed on a first side of the support; a second bidirectional communications port disposed on a second side, opposite the first side, of the support; and a communication apparatus disposed on the support and in communications with the detection apparatus, the first bidirectional communications port and the second bidirectional communications port. The communication apparatus is structured to communicate to another device via at least one of the first communications port or the second communications port at least a first parameter of the circuit interrupter based at least in part upon the at least first operational aspect. One of the first bidirectional communications port or the second bidirectional communications port of one metering apparatus of the at least two metering apparatuses is in direct communication with the computing device and the other of the first bidirectional communications port or the second bidirectional communications port of the one metering apparatus is in direct communication with one of the first bidirectional communications port or the second bidirectional communications port of another one of the at least two metering apparatuses.

BRIEF DESCRIPTION OF THE DRAWINGS

A further understanding of the disclosed and claimed concept can be gained from the following Description of the Preferred Embodiments when read in conjunction with the accompanying figures in which:

Similar numerals refer to similar parts throughout the specification.

DESCRIPTION OF THE PREFERRED EMBODIMENTS

An improved metering apparatus 4 in accordance with the disclosed and claimed concept is indicated generally in FIGS. 1-4 and 6-11. The metering apparatus 4 is structured to be electrically connected with a circuit interrupter, such as circuit breaker 8, as is indicated generally in FIGS. 4-11. More particularly, the circuit breaker 8 includes a number of line terminals 10 and a number of load terminals 12 as is generally understood in the relevant art. As employed herein, the expression "a number of" and variations thereof shall refer broadly to any non-zero quantity, including a quantity of one. The metering apparatus 4 can be advantageously connected with either the line terminals 10 or the load terminals 12 of the circuit breaker 8, but in the embodiment depicted herein the metering apparatus 4 is depicted as being electrically connected with the load terminals 12.

Figure 1:
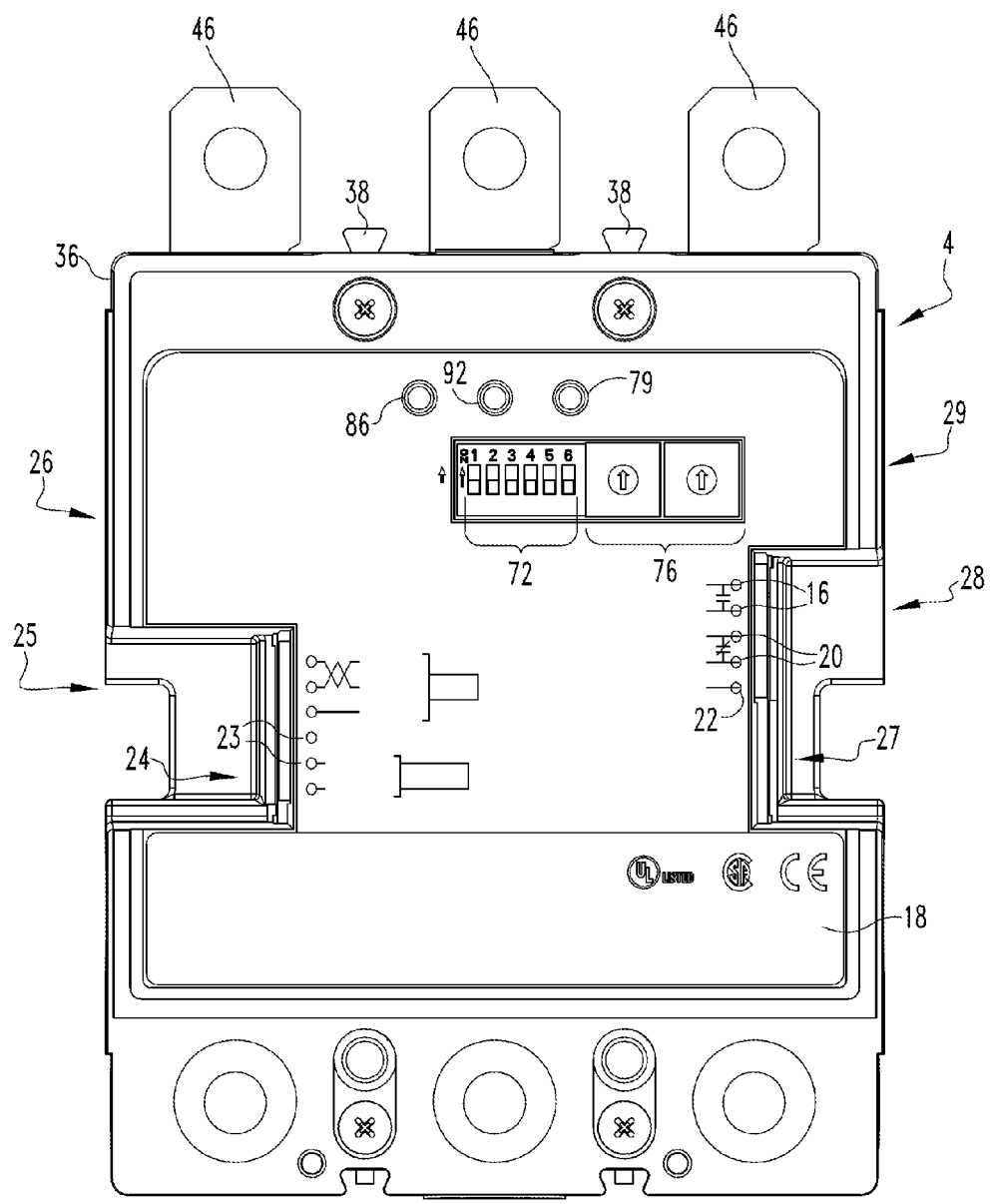
FIG. 1 is a top plan view of an improved metering apparatus in accordance with the disclosed and claimed concept.
Figure 4:
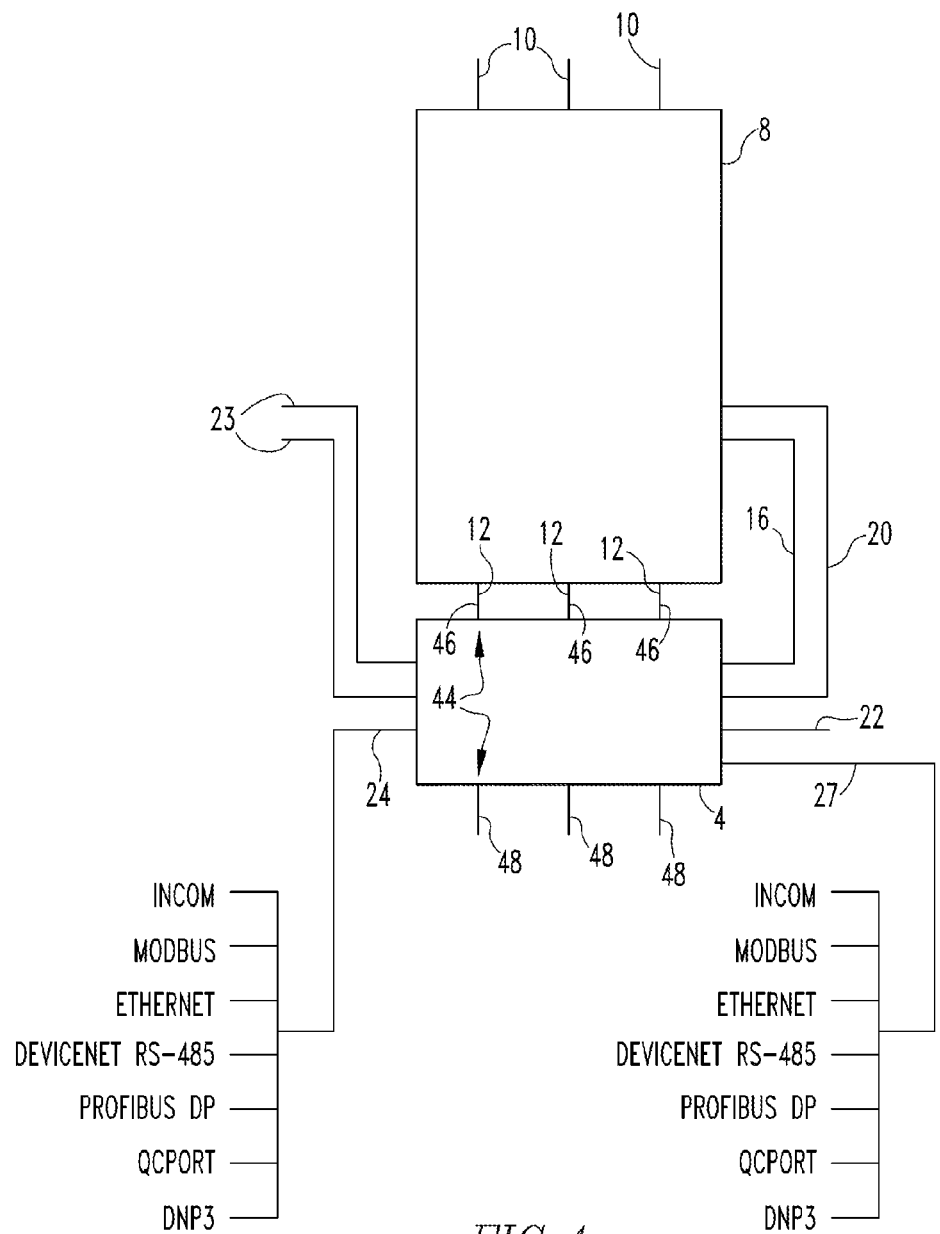
FIG. 4 is a schematic depiction of the metering apparatus of FIG. 1 operationally connected with a circuit breaker.

As can be understood from FIGS. 1 and 4, the metering apparatus 4 includes a bell alarm input 16 that is connected with a bell alarm output of the circuit breaker 8, auxiliary switch inputs 20 that are connected with auxiliary switch outputs of the circuit breaker 8, and a V neutral input 22. As discussed in greater detail below, the bell alarm input 16 and the auxiliary switch input 20 enable the metering apparatus 4 to determine whether the circuit breaker 8 has an operational status that is in an ON condition, an OFF condition, or a TRIPPED condition. The V neutral input 22 provides a voltage reference for measurement.

The metering apparatus 4 further includes an auxiliary power input 23 which can be independent of the circuit breaker 8 and which enables the metering apparatus 4 to be electrically powered even when the circuit breaker 8 is in an OFF or TRIPPED condition. In the exemplary embodiment depicted herein, the auxiliary power input 23 receives 24 volts DC, but other power inputs can be employed without departing from the present concept.

Figure 2:
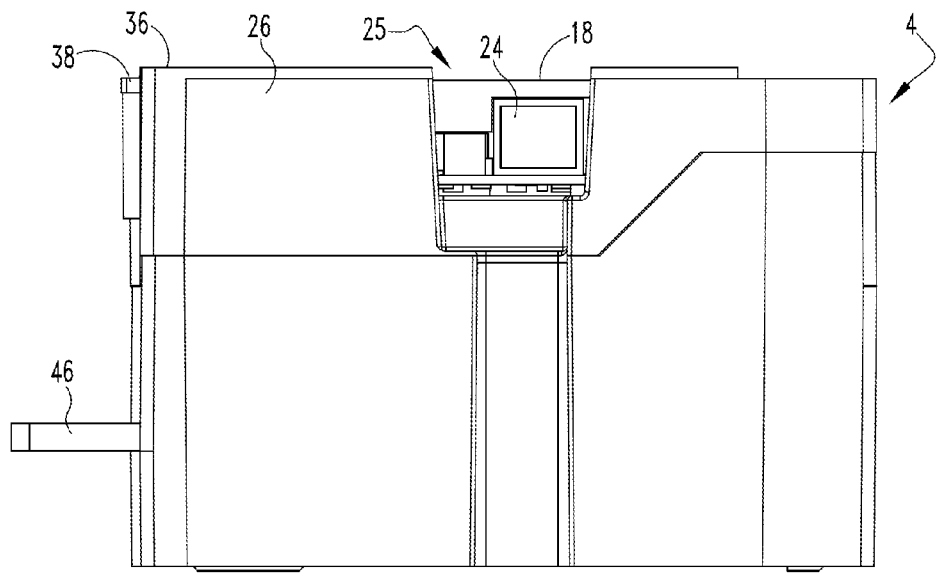
FIGS. 2 and 3 are side elevation views of the metering apparatus of FIG. 1.
Figure 3:
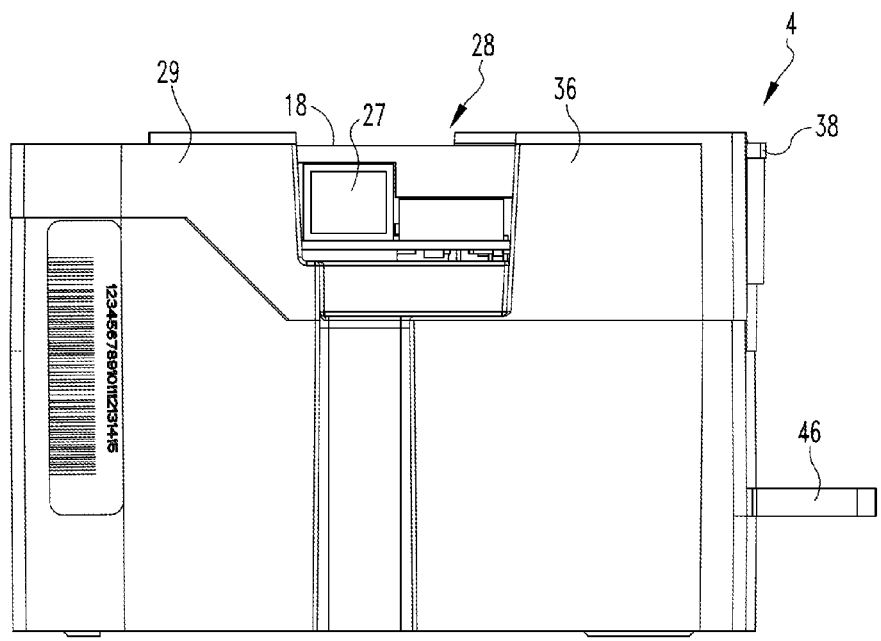

As will be discussed in greater detail below, the metering apparatus 4 additionally includes a first bidirectional communications port 24 disposed in an alcove 25 on a first side 26 of the metering apparatus 4 and a second bidirectional communications port 27 disposed in an alcove 28 on an opposite second side 29 of the metering apparatus 4. As shown in FIGS. 1-3, each alcove generally 25, 28 opens to both a respective side 26, 29 as well as to the top face 18 of the metering apparatus. Additionally, one or both of the ports 24, 27 and/or the alcoves 25, 28 are disposed generally opposite each other, the significance of which is discussed in greater detail below in conjunction with FIGS. 10 and 11. Although shown disposed generally perpendicular to the top face 18, it is to be appreciated that the positioning of one or both of communications ports 24 and 27 within their respective alcoves 25 and 28 may be varied without varying from the scope of the disclosed concept. It is also to be appreciated that the general structure of each alcove 25, 28 generally provides for access to each of the communications ports 24 and 27 from either of the respective sides 26, 29, as well as the top surface 18, of the metering apparatus 4.

As discussed further below, each bidirectional communications port 24, 27 is structured to receive and/or provide communication to another device using any of a variety of established communications protocols. By way of example, the metering apparatus 4 can be configured to communicate with the other device using the Ethernet communications protocol, and the Ethernet protocol is the exemplary protocol employed in the depicted embodiment. Alternatively, the metering apparatus 4 can be configured to employ other communications protocols such as, for example and without limitation, INCOM, ModBus, DeviceNet RS-485, PROFIBUS DP, QCPort, and DNP3, although other communications protocols can be employed without departing from the present concept. Advantageously, the metering apparatus 4 can be retrofitted to use a different protocol in communicating with another device merely by removing and replacing a printed circuit board of the metering apparatus 4 with another circuit board (as well as the communications ports 24, 27), as will be set forth in greater detail below. It is to be appreciated that the arrangement of bi-directional communications ports 24 and 27 described herein not only provides for information to be transmitter from or to a particular metering device 4, such arrangement also provides for information to be transmitted through one or more metering devices 4.

Figure 5:
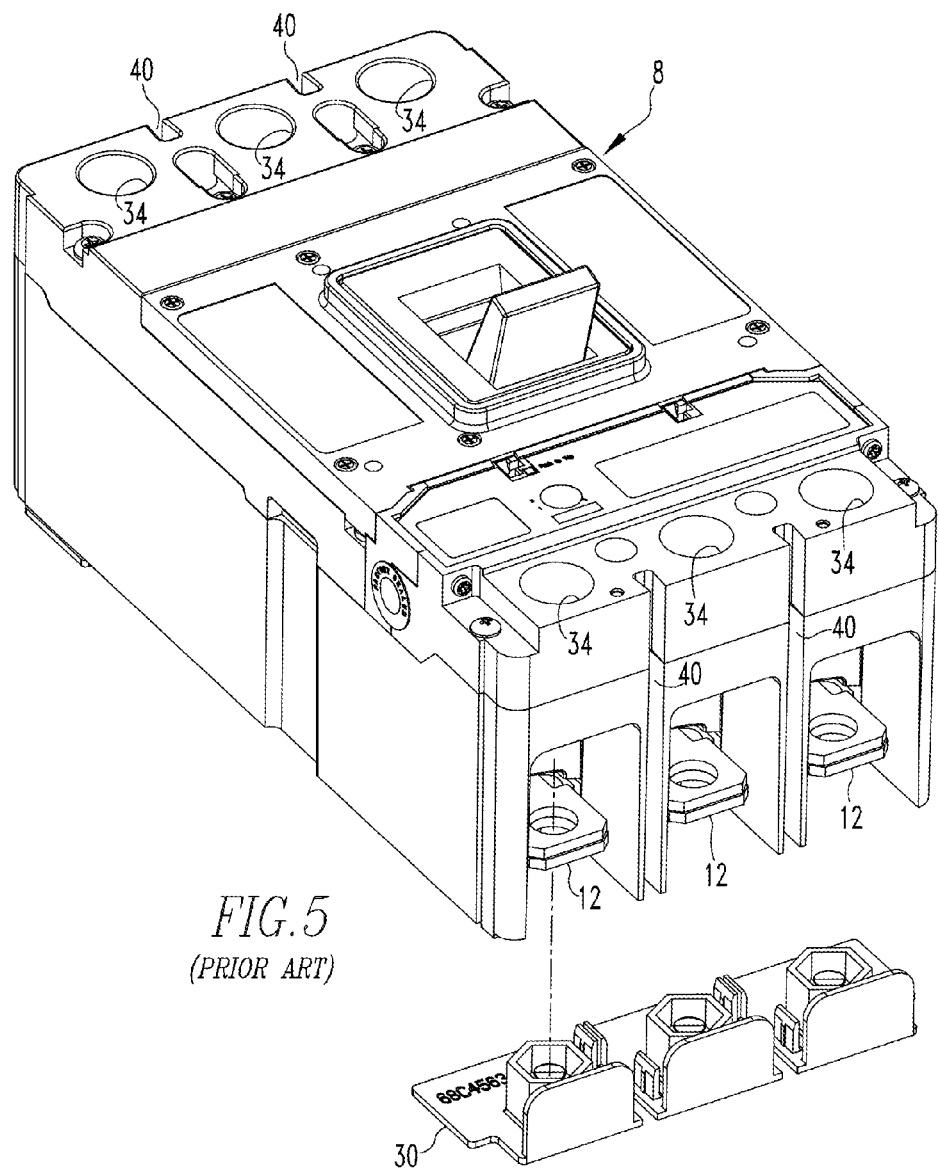
FIG. 5 is an isometric view of a known circuit breaker with which a metering apparatus in accordance with the disclosed and claimed concept may be employed.
Figure 6:
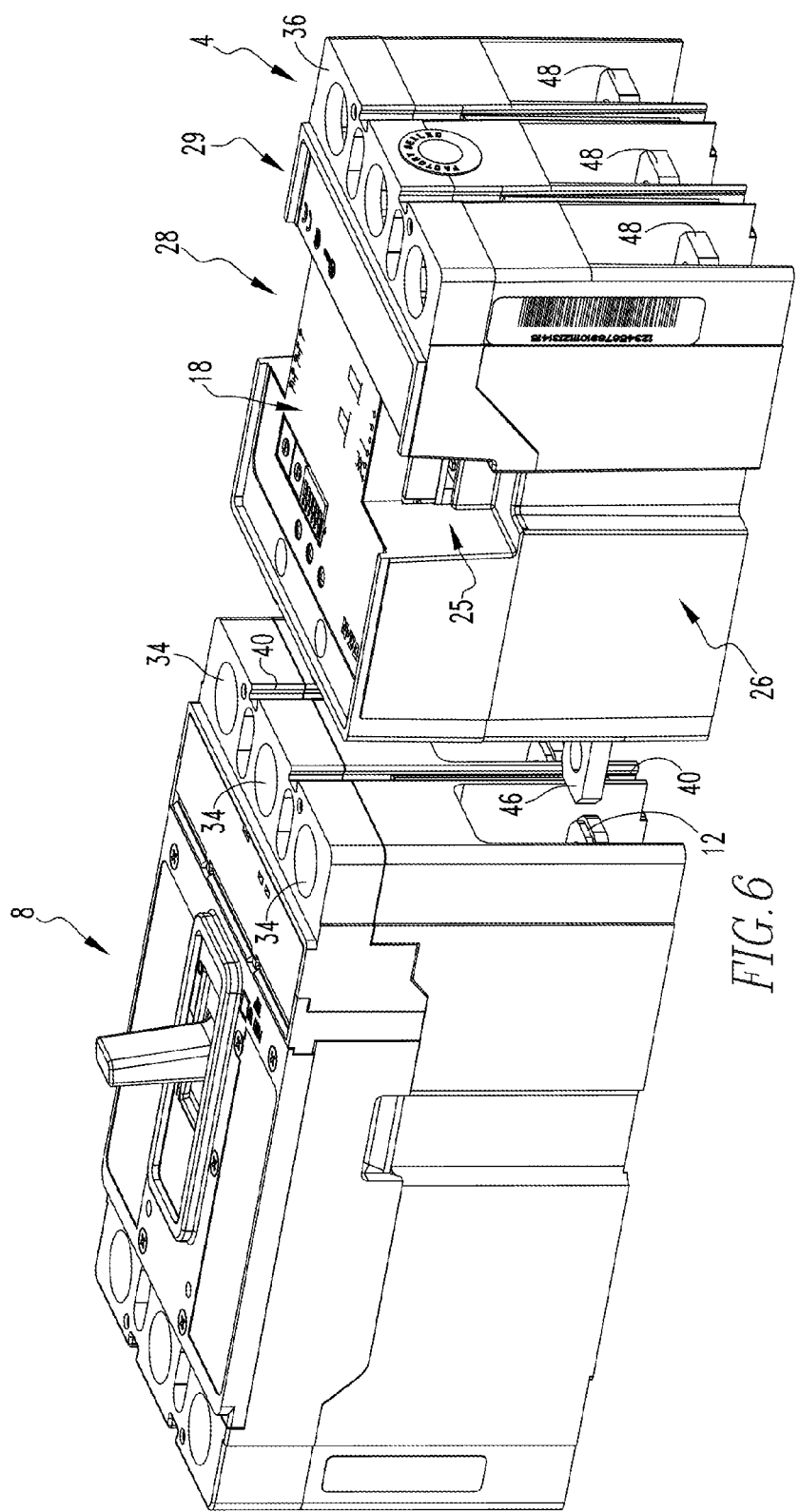
FIGS. 6 and 7 depict the metering apparatus of FIG. 1 being electrically connected with a circuit breaker.
Figure 7:
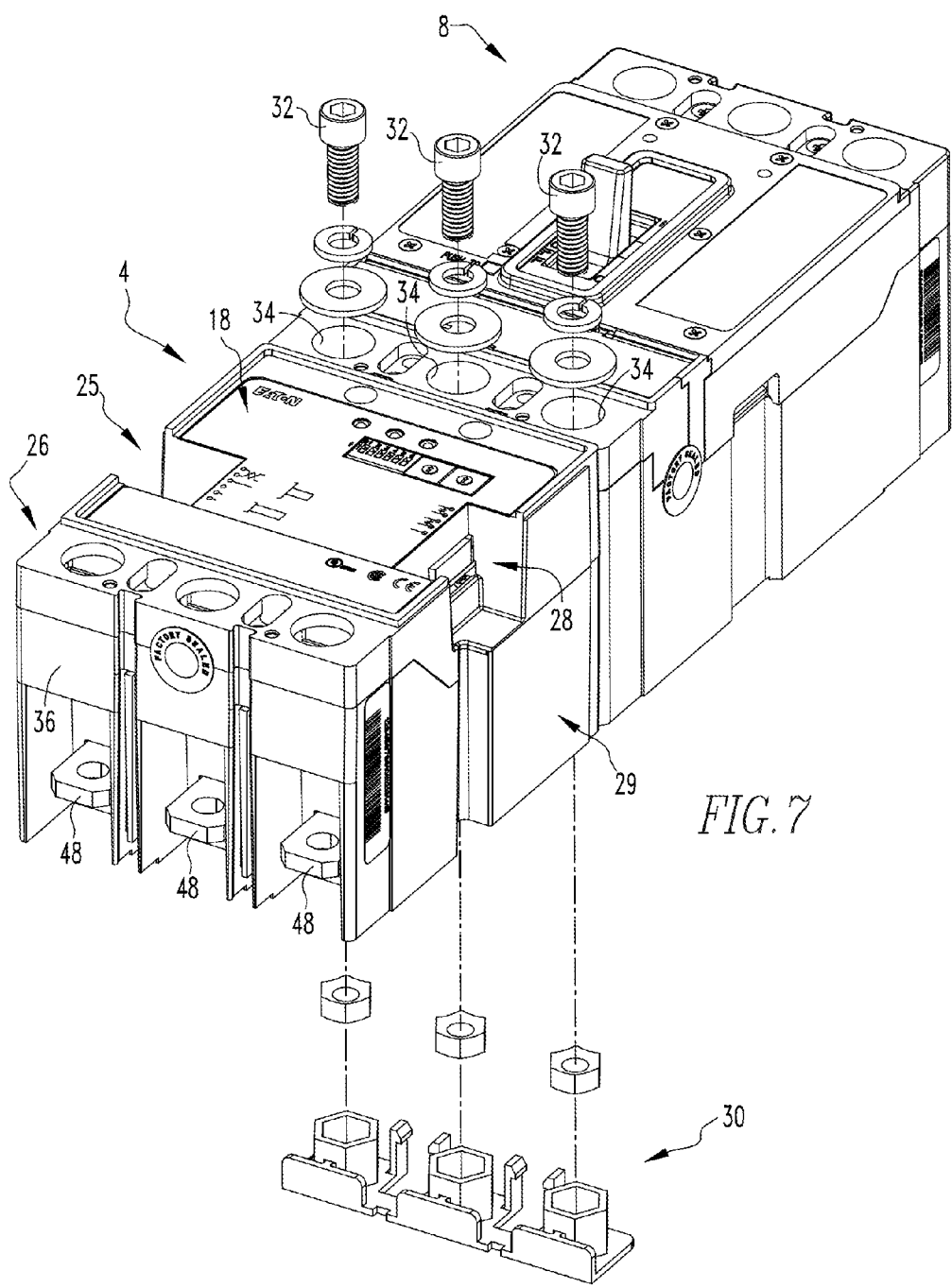

As can be understood from FIGS. 5-7, the metering apparatus 4 can be electrically connected with the line terminals 10 or the load terminals 12 of the circuit breaker 8 by using a connector 30 and a number of fasteners 32 that are received in holes 34 formed in the circuit breaker 8. The metering apparatus 4 includes a housing 36 formed with a number of protruding ribs 38 (FIG. 1) that are receivable in slots 40 (FIG. 5) formed on the circuit breaker 8. When the fasteners 32 are received in the holes 34 and are threadably connected with corresponding portions of the connector 30, the metering apparatus 4 is affixed to the circuit breaker 8 and is electrically connected with either the line terminals 10 or the load terminals 12 of the circuit breaker.

As can be understood from the schematic representation of FIG. 4, the metering apparatus 4 can be said to include a connection apparatus 44 which, in the exemplary embodiment depicted herein, includes a plurality of input terminals 46 and a plurality of output terminals 48. The input terminals 46 are connectable with either the line terminals 10 or the load terminals 12 of the circuit breaker 8, but as suggested elsewhere herein, the input terminals 46 are depicted in the exemplary embodiment herein as being connected with the load terminals 12. The output terminals 48 can include various types of terminal lugs and wiring configurations as could be provided on the circuit breaker 8. The connection apparatus 44 of the metering apparatus 4 is configured to pass current between the input terminals 46 and the output terminals 48, whereby the metering apparatus 4 can be said to function as an extension of the circuit breaker 8.

Figure 8:
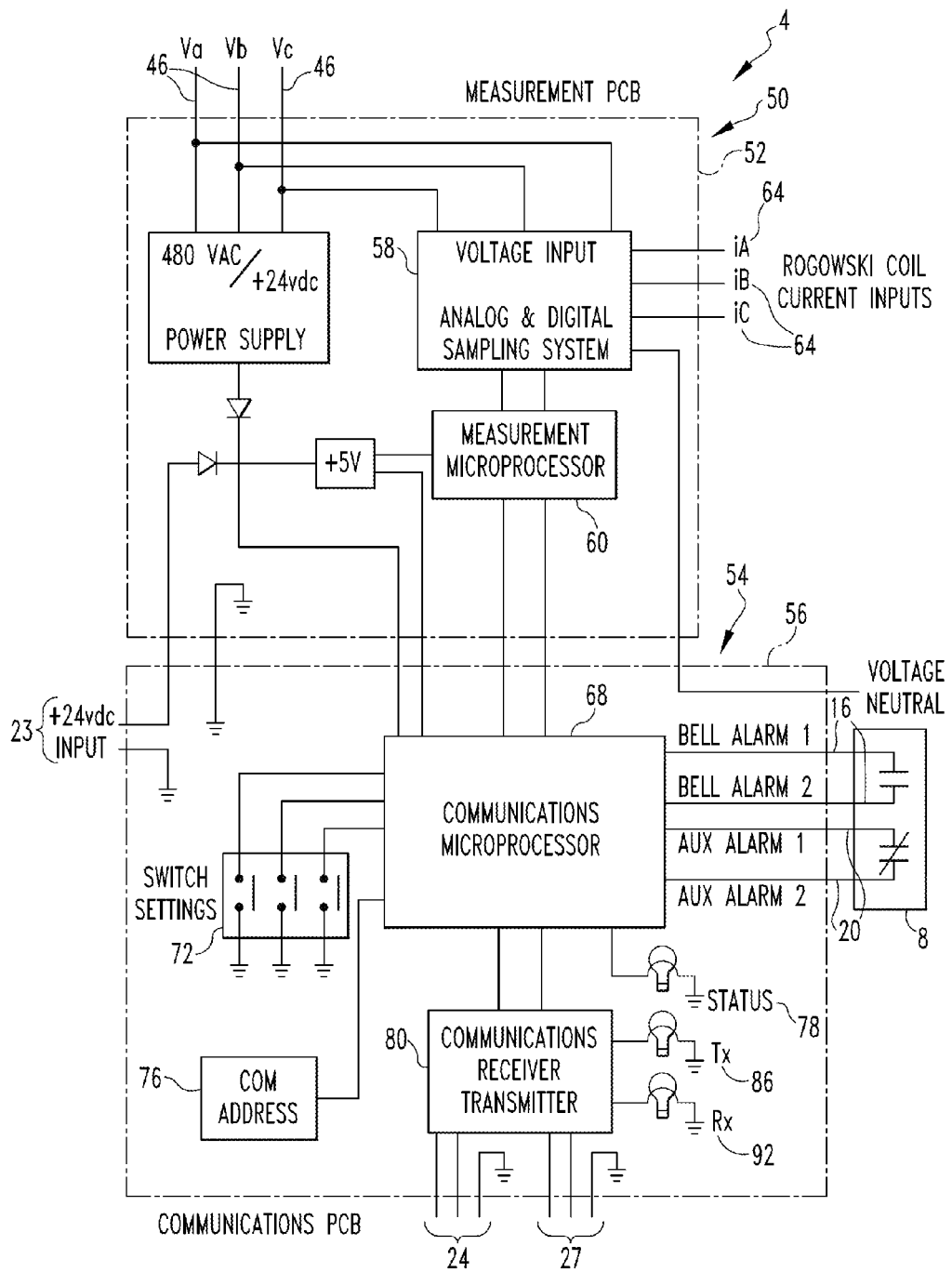
FIG. 8 is a schematic depiction of the metering apparatus of FIG. 1.

Referring to FIG. 8, the metering apparatus 4 can be said to further comprise a detection apparatus 50 that is disposed on the housing 36 and a communication apparatus 54 that is likewise disposed on the housing 36. In this regard, the housing 36 serves as a support to the connection apparatus 44, the detection apparatus 50, and the communication apparatus 54, and further can be said to enclose such components in whole or in part.

The detection apparatus 50 can be said to comprise a measurement printed circuit board (PCB) 52 that includes an analog and digital sampling system 58 and a measurement microprocessor 60 that are operationally connected together. The analog and digital sampling system 58 includes a voltage input for each pole of the circuit breaker 8 to which the metering apparatus 4 is connected. The detection apparatus 50 further includes a Rogowski coil 64 for each pole of the circuit breaker 8, and each Rogowski coil 64 provides a current input to the analog and digital sampling system 58.

The analog and digital sampling system 58 provides signals to the measurement microprocessor 60, which can have its own power input from the auxiliary power input 23. The measurement microprocessor 60 can employ the voltage and current data received from the analog and digital sampling system 58 to derive a variety of operational parameters of the circuit breaker 8. An exemplary set of operational parameters of the circuit breaker 8 are set forth in Table A, below, it being noted that other operational parameters or additional operational parameters or both can be provided by the measurement microprocessor 60 without departing from the present concept.

TABLE A

| Waveform Capture | Power Factor | Reverse Energy | Currents Ia Ib Ic (No Ig no In) | Time Stamping - Real time clock based on protocol |
| --- | --- | --- | --- | --- |
| Harmonics % Content | Peak Demand | Forward Energy | Volts Va Vb Vc line to line | |
| Total Harmonic Distortion ($17^{th}$ or better Harmonic) | Present Demand | Total Energy | Frequency | Revenue Grade Metering |
| RMS Sensing | | | Remote signal contacts - breaker status Aux/Bell | Digital display Use DigiView for displaying |
| MAC Address | Event capture | Communicate cause of trip (after breaker trips) based on observed conditions | | ITIC (CEBEMA) curves/data to see voltage sags |

The communication apparatus 54 can be said to comprise a communications printed circuit board (PCB) 56. In the exemplary embodiment depicted herein, the communications PCB 56 includes a communications microprocessor 68 and a communications receiver transmitter 80. Advantageously, the communications PCB 56 is configured to communicate with another device using an established protocol as mentioned elsewhere herein. Further advantageously, the communications PCB 56 can be removed from the housing 36 and replaced with an alternate communications PCB (not expressly depicted herein) that can employ a different protocol to communicate with the other device. Thus, the metering apparatus 4 can be upgraded to communicate using various communications protocols merely by swapping the communications PCB 56 (as well as communications ports 24, 27 where applicable) with another.

The communications microprocessor 68 has as inputs the aforementioned bell alarm input 16 and auxiliary switch input 20 that are connected with the circuit breaker 8. The communications processor 68 further includes inputs from a number of settable switches 72 and a COM address storage 76, both of which are on the communications PCB 56. The communication microprocessor 68 can additionally include a power input from the auxiliary power 23 or may be powered via power supplied by one of the communications ports 24 or 27. The communications microprocessor 68 further includes a local (STATUS) status light 78 on the housing 36 which visually indicates the general operating status of the metering apparatus 4. For example, without limitation, the status light 78 may blink at 1 Hz to indicate that the metering apparatus is operational, while status light 78 not blinking would indicate the metering apparatus 4 is not working. The status light 78 does not change per the breaker position.

The communications microprocessor 68 derives the status of the circuit breaker 8 based upon inputs from the bell alarm 16 and the auxiliary switch input 20 using a known truth table. More particularly, the bell alarm input 16 indicates the handle position of the circuit breaker 8, which indicates whether or not the circuit breaker 8 is in a TRIPPED condition. The auxiliary input switch 20 indicates whether the contacts of the circuit breaker 8 are in an open or closed condition. By analyzing the inputs from the bell alarm input 16 and the auxiliary switch input 20, the communications microprocessor 68 can derive whether the circuit breaker 8 is an ON condition, an OFF condition, or a TRIPPED condition. The communications microprocessor 60 then can communicate to the communications receiver transmitter 80 such a status of the circuit breaker 8. The communications microprocessor 60 may also communicate the general status (i.e., operational/non-operational) of the metering device 4 to the communications receiver transmitter.

The communications receiver transmitter 80 receives signals from the communications microprocessor 68 that are representative of one or more of the operational parameters set forth in Table A and that are, in turn, received from the measurement microprocessor 60 and have been derived from input to the analog and digital sampling system 58. As such, the status of the circuit breaker 8 as well as the operational parameters of the circuit breaker 8 (such as are mentioned in Table A) that are transmitted from the communications receiver transmitter 80 using one or both of bidirectional communications ports 24, 27, are derived from voltage, current, and other inputs to the analog and digital sampling system 58.

The communications receiver transmitter 80 is connected with a transmit (Tx) status light 86 and a receiver (Rx) status light 92 which visually indicate when the communications transmitter 80 is transmitting and receiving, respectively, signals to and from, respectively, the other device.

The communications receiver transmitter 80 employs an established protocol (e.g., without limitation, Ethernet, INCOM, ModBus, DeviceNet RS-485, PROFIBUS DP, QCPort, DNP3) to communicate with another device or devices using one or more of the first bidirectional communications port 24 and/or the second bidirectional communications port 27.

Figure 9:
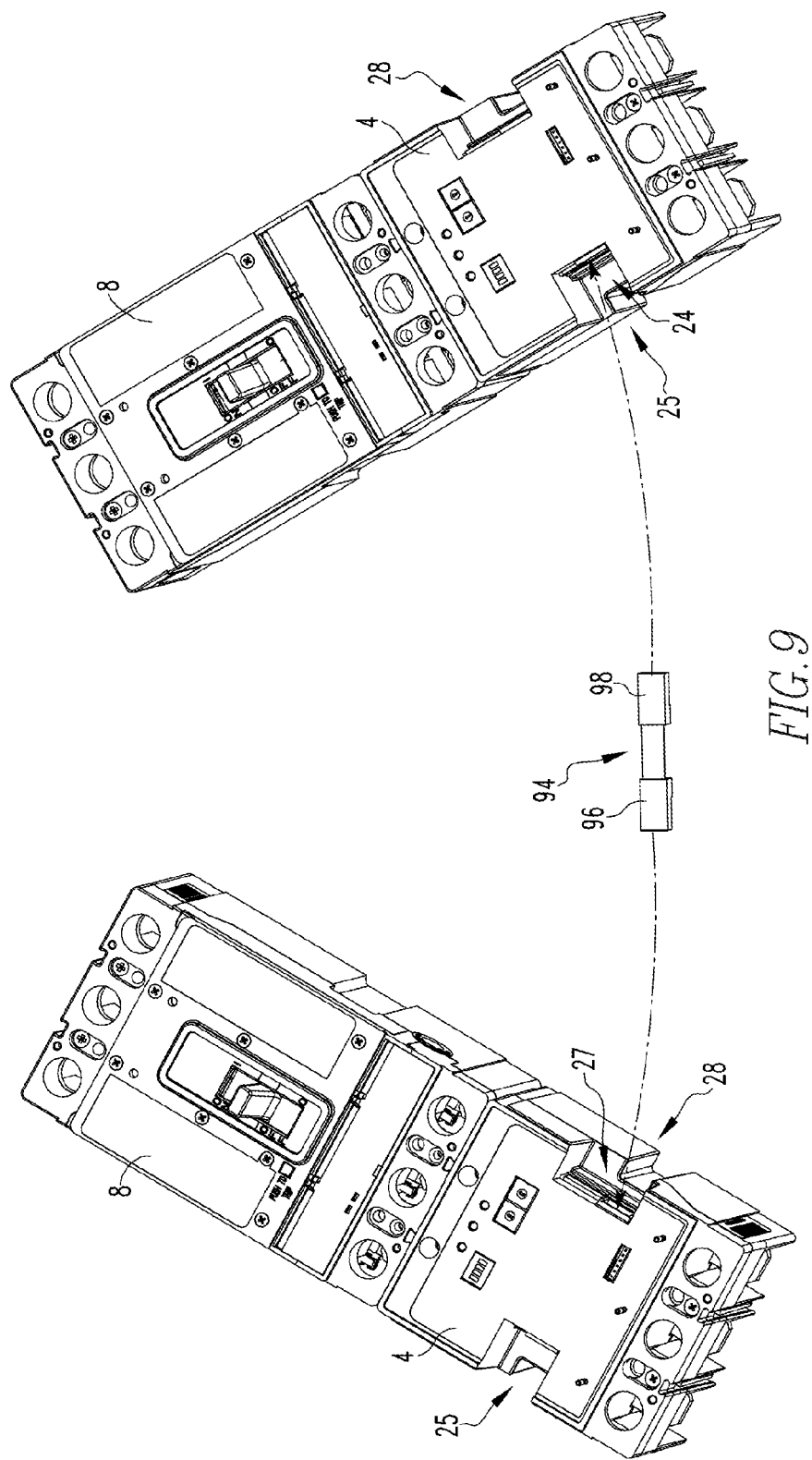
FIG. 9 is a partially exploded view showing two metering apparatuses and connected circuit breakers along with an electrical connector for connecting the metering apparatuses.

Having thus described a metering device 4 in accordance with an example embodiment of the disclosed and claimed concept, use of a plurality of such metering devices 4 in a monitoring system will now be described in conjunction with FIGS. 9-11. FIG. 9, shows a view generally illustrating how the bidirectional communications ports 27, 24 of two metering devices 4 (as well as the circuit interrupters 8 connected therewith) may be electrically connected via the use of a suitable jumper cable 94 having connecting elements 96, 98 which cooperatively engage with communications ports 24 and 27, thus providing for electrical communications between ports 24 and 27.

Figure 10:
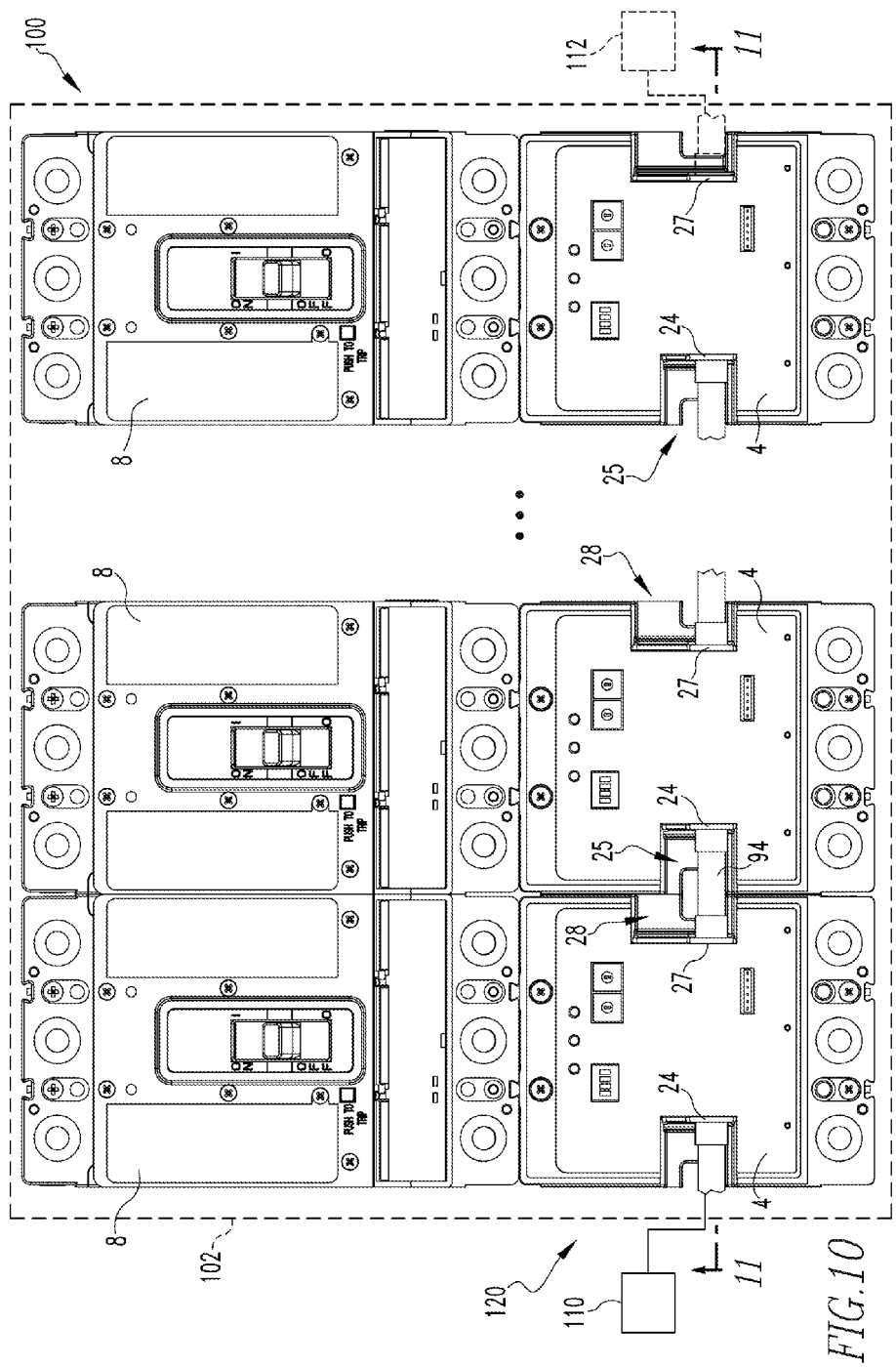
FIG. 10 is a partially schematic top plan view of a portion of an electrical distribution panel including a plurality of metering apparatuses and connected circuit breakers in accordance with an example embodiment of the disclosed and claimed concept.
Figure 11:
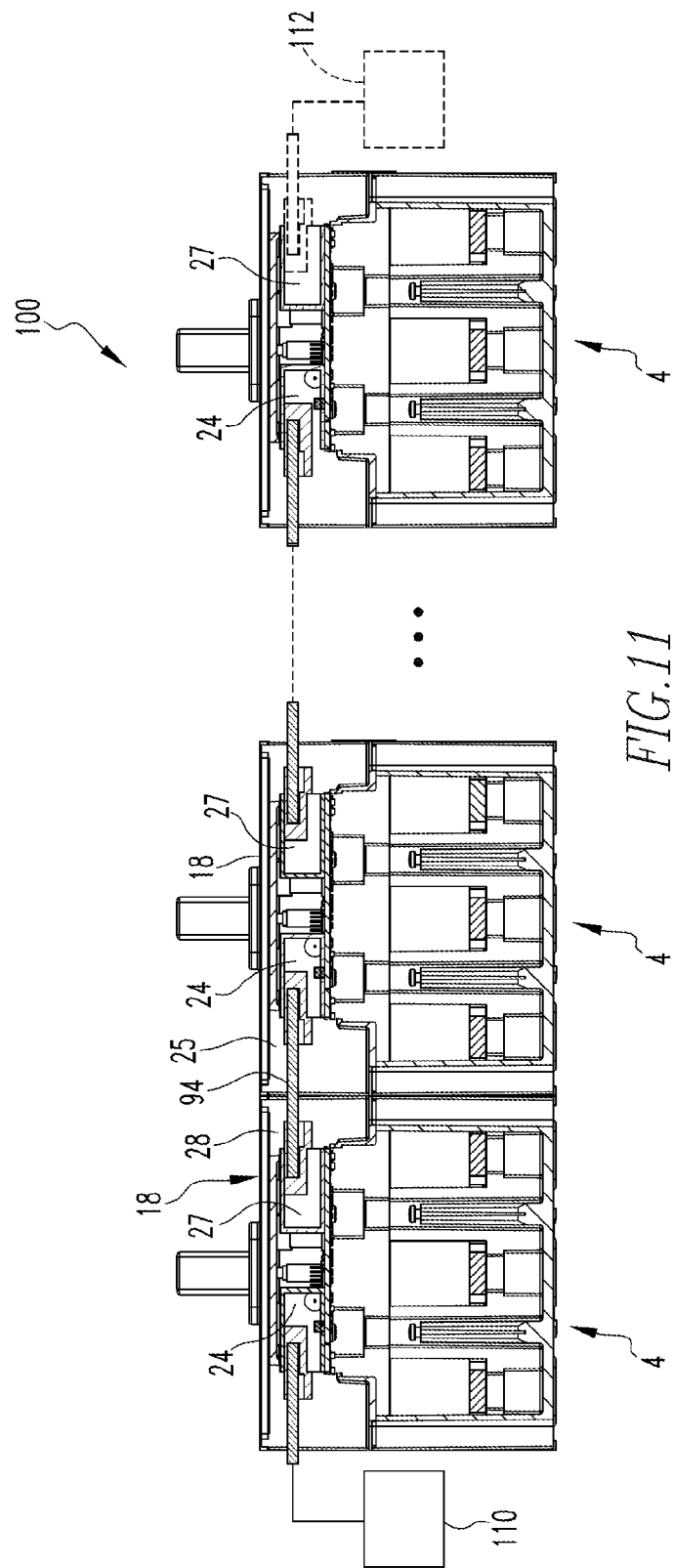
FIG. 11 is a partial sectional view of the portion of the electrical distribution panel of FIG. 10 taken along the line 11-11 of FIG. 10.

FIG. 10 illustrates a top view of an electrical distribution system 100 including a plurality of metering apparatuses 4 and connected circuit breakers 8 disposed within an enclosure 102 (shown schematically in dashed line) in accordance with an example embodiment of the disclosed and claimed concept. In such arrangement, the communications ports 27, 24 of adjacent metering devices are connected via a jumper cable 94 which is disposed within a wireway (not numbered) formed by the alcoves 25, 28 of the adjacent metering devices due to the alcoves 25, 28 of each device being disposed generally opposite of each other on opposing sides of the housing 36. Through such connecting arrangement, a plurality of metering apparatuses 4 may effectively be daisy-chained together in a manner which optimizes space and minimizes the amount/length of connective-member(s). Accordingly, it is to be appreciated that the arrangement of the communications ports 24, 27 as well as the alcoves 25, 28 in which they are disposed, provides for multiple metering apparatuses to be disposed in close proximity to each other and provides for connective wiring to be minimized. In such arrangement, each of the metering apparatuses 4 may be powered via the respective auxiliary power inputs 23 thereof, or alternatively, may be powered via one of the communications ports 24, 27 thereof.

A computing device 110 (or alternatively 112) is electrically coupled to the communications port 24 (or alternatively 27) of an end one of the metering apparatuses 4 (and thus is in direct communication therewith) and receives signals from, and/or provides signals to, any of the metering apparatuses 4 in the electrically connected chain. As used herein, the phrase "in direct communication" shall be used to refer to components which are in electrical communication with each other without any intermediary components. Computing device 4, for example, without limitation, may be a building management system, a programmable logic controller (PLC), a generic computer terminal, or any other suitable computing device, without departing from the scope of the disclosed and claimed concept. The computing device 110 along with all of the metering apparatuses in communication therewith, collectively form an example metering system 120, in accordance with the disclosed and claimed concept.

In addition to the features previously discussed, the metering apparatus 4 can further advantageously be configured according to the environment of its connection with circuit breaker 8. For instance, the input terminals 46 of the metering apparatus can be connected with either the line terminals 10 or the load terminals 12 of the circuit breaker 8. In a circumstance where the input terminals 46 are connected with the line terminals 10 of the circuit breaker 8, the communications receiver transmitter 80 might communicate a reverse energy value to the other device. The metering apparatus 4 thus can be configured to instead report forward energy instead of reverse energy in order to maintain consistency with other metering apparatuses 4 and circuit breakers 8, by way of example.

Moreover, the poles of the metering apparatus 4 can be reconfigured depending upon the needs of the application. As a default, the poles of the metering apparatus 4, as represented by the three input terminals 46 in FIGS. 1 and 8, are designated as A, B, and C when going left-to-right from the perspective of FIGS. 1 and 8. If necessary, the poles can be reconfigured to be designated as C, B, and A when moving from left-to-right from the perspective of FIGS. 1 and 8. Such a re-designation of the poles may be useful in any of a variety of applications, such as if the circuit breakers 8 and metering apparatuses 4 of a given switchgear cabinet (not expressly depicted herein) are mounted in two different orientations. This is a typical application since the line terminals of the switchgear cabinet are typically situated centrally on a switchgear cabinet and the load terminals are disposed peripherally on the switchgear cabinet. In such a scenario, the metering apparatuses 4 may be connected with the peripheral, load ends of the circuit breakers 8. However, the vertically uppermost pole of a metering apparatus 4 at one of the side of the switchgear cabinet might have a default designation of A whereas the vertically uppermost pole of a metering apparatus 4 on the opposite side of the switchgear cabinet might have a default designation of C. It thus may be desirable to alter the designation of such an uppermost pole from C to A and in order that all of the uppermost poles are A, and to re-designate a lowermost pole from A to C in order that all of the lowest poles are designated as C. Other uses of such a feature will be apparent.

It thus can be seen that the improved metering apparatus 4 can be connected with the poles of the circuit breaker 8 and can provide metering of various operational parameters and operational conditions of the circuit breaker 8. Such operational parameters and conditions can be communicated to another device using any of a variety of known protocols, which protocol can be changed merely by swapping the communications PCB 56 with another. The metering apparatus 4 additionally may include a power input that is independent of the circuit breaker 8 in order to enable the metering apparatus 4 to remain powered even if a circuit breaker 8 is in an OFF or TRIPPED condition.

While specific embodiments of the disclosed and claimed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of concept which is to be given the full breadth of the claims appended and any and all equivalents thereof.

What is claimed is:
1. A metering system comprising:
   a computing device; and
   a plurality of metering apparatuses, each metering apparatus comprising:
      a support;
      a connection apparatus disposed on the support and structured to be electrically connected with a circuit interrupter;
      a detection apparatus disposed on the support and structured to detect at least a first operational aspect of the circuit interrupter;
      a first bidirectional communications port disposed on a first side of the support;
      a second bidirectional communications port disposed on a second side, opposite the first side, of the support; and
      a communication apparatus disposed on the support and in communications with the detection apparatus, the first bidirectional communications port and the second bidirectional communications port, the communication apparatus being structured to communicate to another device via at least one of the first communications port or the second communications port at least a first parameter of the circuit interrupter based at least in part upon the at least first operational aspect,
   wherein one of the first bidirectional communications port or the second bidirectional communications port of a first metering apparatus of the plurality of metering apparatuses is in direct communication with the computing device,
   wherein the other of the first bidirectional communications port or the second bidirectional communications port of the first metering apparatus of the plurality of metering apparatuses is in direct communication with one of the first bidirectional communications port or the second bidirectional communications port of a second metering apparatus of the plurality of metering apparatuses,
   wherein, for each metering apparatus, the first communications port is disposed in a first alcove formed on the first side of the support and the second communications port is disposed in a second alcove formed on the second side of the support,
   wherein the first alcove opens to the first side of the support and to a top face of the support,
   wherein the second alcove opens to the second side of the support and to the top face of the support,
   wherein the first metering apparatus and the second metering apparatus are disposed such that the second side of the first metering apparatus is adjacent the first side of the second metering apparatus such that second alcove of the first metering apparatus and the first alcove of the second metering apparatus together generally form a wireway,
   wherein the first bidirectional communications port of the first metering apparatus is in direct communication with the computing device,
   wherein the second bidirectional communications port of the first metering apparatus is in direct communication with the first bidirectional communications port of the second metering apparatus, and
   wherein the direct communication between the second bidirectional communications port of the first metering apparatus and the first bidirectional communications port of the second metering apparatus is provided by a jumper cable disposed completely within the wireway.

2. The metering system of claim 1, wherein the first metering apparatus comprises an auxiliary power input through which the first metering apparatus is powered and wherein the second metering apparatus is powered via power received via the one of the first bidirectional communications port or the second bidirectional communications port of the second metering apparatus.

3. The metering system of claim 1, wherein the first metering apparatus is powered via the one of the first bidirectional communications port or the second bidirectional communications port which is in direct communication with the computing device and wherein the second metering apparatus is powered via power received via the one of the first bidirectional communications port or the second bidirectional communications port thereof.

4. The metering system of claim 1, wherein the first bidirectional communications port and the second bidirectional communications port of each metering apparatus of the plurality of metering apparatuses are disposed generally opposite from each other.

\* \* \* \* \*